(12) United States Patent
Xu et al.

(10) Patent No.: US 10,304,901 B1
(45) Date of Patent: May 28, 2019

(54) MICRO LIGHT-EMITTING DIODE DISPLAY DEVICE AND MANUFACTURING METHOD THEREOF

(71) Applicant: Wuhan China Star Optoelectronics Technology Co., Ltd., Wuhan, Hubei (CN)

(72) Inventors: Haile Xu, Hubei (CN); Shunjie Shen, Hubei (CN); Jiangjiang Song, Hubei (CN); Fenli Zhao, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/749,395

(22) PCT Filed: Nov. 30, 2017

(86) PCT No.: PCT/CN2017/114046
§ 371 (c)(1),
(2) Date: Jan. 31, 2018

(30) Foreign Application Priority Data

Nov. 27, 2017  (CN) .......................... 2017 1 1206341

(51) Int. Cl.
| | |
|---|---|
| G02F 1/1335 | (2006.01) |
| H01L 27/15 | (2006.01) |
| H01L 25/075 | (2006.01) |
| G09G 3/20 | (2006.01) |
| G03F 7/00 | (2006.01) |

(Continued)

(52) U.S. Cl.
CPC ............ *H01L 27/156* (2013.01); *G02B 5/201* (2013.01); *G03F 7/0007* (2013.01); *G09G 3/2003* (2013.01); *G09G 3/32* (2013.01); *H01L 25/0753* (2013.01)

(58) Field of Classification Search
CPC ...................... G02F 1/133514; H01L 25/0753
See application file for complete search history.

(56) References Cited

U.S. PATENT DOCUMENTS

| | | |
|---|---|---|
| 8,928,021 B1 | 1/2015 | Bibl et al. |
| 2018/0151543 A1* | 5/2018 | Lee .......................... H01L 33/62 |

FOREIGN PATENT DOCUMENTS

| | | |
|---|---|---|
| CN | 103592815 A | 2/2014 |
| CN | 103779375 A | 5/2014 |
| CN | 103885242 A | 6/2014 |

* cited by examiner

*Primary Examiner* — Thomas L Dickey
(74) *Attorney, Agent, or Firm* — Hauptman Ham, LLP

(57) ABSTRACT

The present invention discloses a micro light-emitting diode display device comprising a substrate, micro light-emitting diodes arrayed on an upper surface of a substrate for emitting blue light, a yellow phosphor layer disposed on a light-emitting side of the micro light-emitting diodes, and a color filter layer disposed on a light-emitting side of the yellow phosphor layer. The color filter layer comprises a red filter area, a green filter area, and a light-transmitting area. The yellow phosphor layer is provided with light-transmitting holes opened to its surface at intervals, and the light-transmitting holes are directly opposite to the light-transmitting area. The present invention further provides a method of manufacturing a micro light emitting diode display device. A color display purpose is achieved, which reduces the times of transferring the light-emitting diodes, simplifies the manufacturing process, and reduces technical difficulty for transferring micro LED.

18 Claims, 2 Drawing Sheets

(51) Int. Cl.
*G09G 3/32* (2016.01)
*G02B 5/20* (2006.01)

MICRO LIGHT-EMITTING DIODE DISPLAY DEVICE AND MANUFACTURING METHOD THEREOF

RELATED APPLICATIONS

The present application is a National Phase of International Application Number PCT/CN2017/114046, filed Nov. 30, 2017, and claims the priority of China Application 201711206341.4, filed Nov. 27, 2017.

BACKGROUND OF THE INVENTION

1. Field of the Invention

The present invention relates to a field of display technology, and in particular, to a micro light-emitting diode display device and a manufacturing method thereof.

2. The Related Arts

Micro LED (micro-LED) technology, i.e., LED miniaturization matrix technology, refers to a high-density small-size LED arrays integrated on a single chip. Each pixel in the LED display panel can be addressed and driven individually. The micro LED display panel can be seen as a miniature version of an outdoor LED display panel, which reduces the pixel distance from a millimeter-level down to a micron-level.

Micro LED has many advantages. It has the advantages of high efficiency, high brightness, high reliability and fast response time of inorganic LED. It has the advantages of self-illumination without backlight and more advantages of energy saving, small size and simple mechanism.

Usually, the manufacturing method of the micro-LED is as follows. First, LED micro-devices are epitaxially grown by a molecular beam on a sapphire substrate. Second, the LED micro-devices are transferred to a glass substrate. Since the size of the sapphire substrate for fabricating the LED micro-devices is essentially the size of a silicon wafer, and since the material to make the display is a much larger glass substrate, there is a need to make multiple transfers. Moreover, LED dies of red, green and blue primary colors need to be transferred respectively from an original substrate to an accepting substrate to form the red, green and blue arrays. Since such transfer involves a precise transfer for a large number of micro LED and a transfer of a large number of times, the transfer process takes a long time and its technical difficulty is quite large.

SUMMARY

In view of the shortcomings of conventional technology, the present invention provides a micro light-emitting diode display device and a method of fabricating the same that reduces the number of transfer times for the LED and reduces the difficulty of the micro LED transfer technology.

In order to achieve the above object, the present invention adopts the following technical solutions.

A micro light-emitting diode display device includes a substrate, micro light-emitting diodes arrayed on an upper surface of a substrate for emitting blue light, a yellow phosphor layer disposed on a light-emitting side of the micro light-emitting diodes, and a color filter layer disposed on a light-emitting side of the yellow phosphor layer. The color filter layer comprises a red filter area, a green filter area, and a light-transmitting area. The yellow phosphor layer is provided with light-transmitting holes opened to its surface at intervals, and the light-transmitting holes are directly opposite to the light-transmitting area.

As one of the embodiments, each of the micro light-emitting diodes is directly opposite to one of the red filter area, the green filter area, and the light-transmitting area.

As one of the embodiments, the light-transmitting area is a transparent filter area.

Alternatively, the light-transmitting area is a through hole formed in the color filter layer.

As one of the embodiments, the through hole is filled with a colorless transparent material, and the surface of the colorless transparent material is co-planar with the surface of the color filter layer.

As one of the embodiments, the micro-LED display device further includes a protective layer formed on an upper surface of the substrate and covering all the micro-LEDs. An upper surface of the protective layer is planar. The yellow phosphor layer is formed on the surface of the protective layer.

As one of the embodiments, the yellow phosphor layer is disposed on the upper surface of the protective layer and bonded to the color filter layer.

Alternatively, the yellow phosphor layer is disposed on a surface of the protective layer that faces the micro-LEDs, and the color filter layer is bonded to the upper surface of the protective layer.

As one of the embodiments, the micro-LED device further includes a black matrix layer for shielding light. Each pair of two adjacent areas of the red filter area, the green filter area and the light-transmitting area of the color filter layer is provided with a hollow slit between the two adjacent areas, and the black matrix layer is filled in the slits.

Another object of the present invention is to provide a method of manufacturing a micro light emitting diode display device, comprising:

providing a substrate;

forming micro light-emitting diodes for emitting blue light on an upper surface of the substrate;

forming a protective layer on the upper surface of the substrate to simultaneously cover the micro light-emitting diodes and the substrate;

forming a black matrix layer having a lattice pattern on an upper surface of the protection layer;

forming a yellow phosphor layer that is filled in the black matrix layer pattern and on the upper surface of the protective layer, wherein the yellow phosphor layer is formed with light-transmitting holes at intervals opened to the surface and has a thickness smaller than the thickness of the black matrix layer; and forming a color filter layer in the black matrix layer pattern and in the light-transmitting holes, wherein the color filter layer comprises a red filter area, a green filter area and a light-transmitting area, and the light-transmitting area is right opposite to the corresponding light transmitting hole.

The micro light-emitting diodes of the present invention all emit blue light. By means of transferring the micro LEDs to the substrate at one time, and making it to excite the yellow phosphor layer meanwhile cooperate with the color filter layer in a light-emitting direction, a color display purpose could be achieved, which reduces the times of transferring the light-emitting diodes, simplifies the manufacturing process, and reduces technical difficulty for transferring micro LED.

DETAILED DESCRIPTION OF THE PREFERRED EMBODIMENTS

Figure 1:
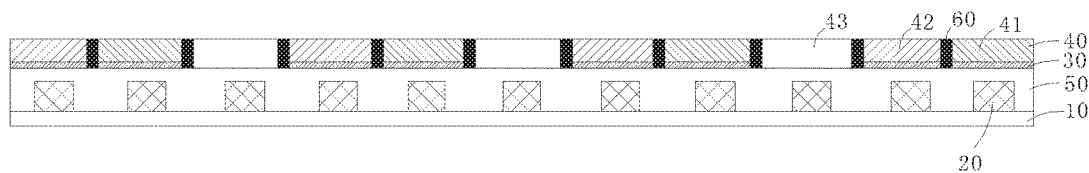
FIG. 1 is a schematic structural diagram of a micro light emitting diode display device according to an embodiment of the present invention.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Referring to FIG. 1, a micro-LED display device according to an embodiment of the present invention includes a substrate 10, micro-LEDs 20 disposed on an upper surface of the substrate 10 in matrix for emitting blue light, a yellow phosphor layer 30 disposed on a light-emitting side of the micro-LEDs 20, and a color filter layer 40 disposed on a light emitting side of the yellow phosphor layer 30. The color filter layer 40 includes a red filter area 41, a green filter area 42, and a light transmitting area 43. The yellow phosphor layer 30 is provided with light-transmitting holes 300 at intervals opened to the surface of the yellow phosphor layer 30 and the light-transmitting holes 300 are right faced to or aligned with the light-transmitting area 43.

Since all the micro light emitting diodes 20 of the present embodiment emit the same blue light, the micro light emitting diodes 20 can be fabricated on the array substrate at one time using a transfer technique. In this embodiment, all the micro light emitting diode 20 are respectively faced to or aligned with one of the red filter area 41, the green filter area 42, and the light transmitting area 43. The blue light emitted by the micro light emitting diodes 20 right disposed below respective areas excites the yellow phosphor layer 30 to emit yellow light. In the display area corresponding to the red filter area 41 and the green filter area 42, the yellow light passes through the red filter area 41 to emit red light, and the yellow light passes through the green filter area 42 to emit green light. In the display area corresponding to the light-transmitting area 43, the blue light emitted by the micro-LED 20 passes through the light-transmitting hole 300 and the light-transmitting area 43 in sequence. Finally, the light emitted through the color filter layer 40 contains blue, green and red, covering the three primary colors. By controlling the current supplied to each micro-LED 20, the light intensity of each pixel can be controlled, and thus the purpose of color display can be achieved.

The micro-LED display device of the present embodiment further includes a protective layer 50 formed on a top surface of the substrate 10 and covering all the micro-LEDs 20. The top surface of the protective layer 50 is planar. The yellow phosphor layer 30 is formed on the upper surface of the protective layer 50 by coating or the like and bonded to the color filter layer 40. It should be noted that the yellow phosphor layer 30 does not completely cover the upper surface of the protective layer 50. The yellow phosphor layer 30 is provided with light-transmitting holes 300 at intervals opened to its surface. The light-transmitting hole 300 is right opposite or faced to the light-transmitting area 43 to allow the blue light to directly pass through and emit from the light-transmitting area 43 of the color filter layer 40.

In addition, to prevent crosstalk between two adjacent pixels, the micro-LED device further has a black matrix layer 60 for shielding light. The black matrix layer 60 has a thickness equal to the sum of the thicknesses of the yellow phosphor layer 30 and the color filter layer 40. A hollow slit is provided between two adjacent regions of respective pairs of the red filter region 41, the green filter region 42 and the light-transmitting area 43 of the color filter layer 40. The black matrix layer 60 is filled in the slit such that black matrix layer 60 is shielding between every two adjacent filter area of the color filter layer 40, and the lights from respective filter areas does not interfere with each other. Moreover, the black matrix layer 60 has a bottom end extending to and filling into the light-transmitting hole 300 in the yellow phosphor layer 30. That is, the black matrix layer 60 extends to the upper surface of the protection layer 50 to ensure that a light excited by and emitting from the yellow phosphor layer 30 does not pass through an edge of the bottom of the light-transmitting hole 300 to the light-transmitting area 43 of the color filter layer 40. This in turn further improves the display reliability.

In other embodiments, the yellow phosphor layer 30 may instead be disposed on a surface of the protection layer 50 that faces the micro-LED 20, i.e., its inner surface. The bottom surface of the color filter layer 40 is thus bonded to the upper surface of the protection layer 50, and the thickness of the black matrix layer 60 is equal to the thickness of the color filter layer 40.

The light-transmitting area 43 of the color filter layer 40 may be a transparent filter area, or may be a through-hole formed in the color filter layer 40. The through-hole may be filled with a colorless and transparent material. The surface of the colorless transparent material is co-planar with the surface of the color filter layer 40 to ensure the integrity and strength of the color filter layer 40 and the black matrix layer 60.

Figure 2:
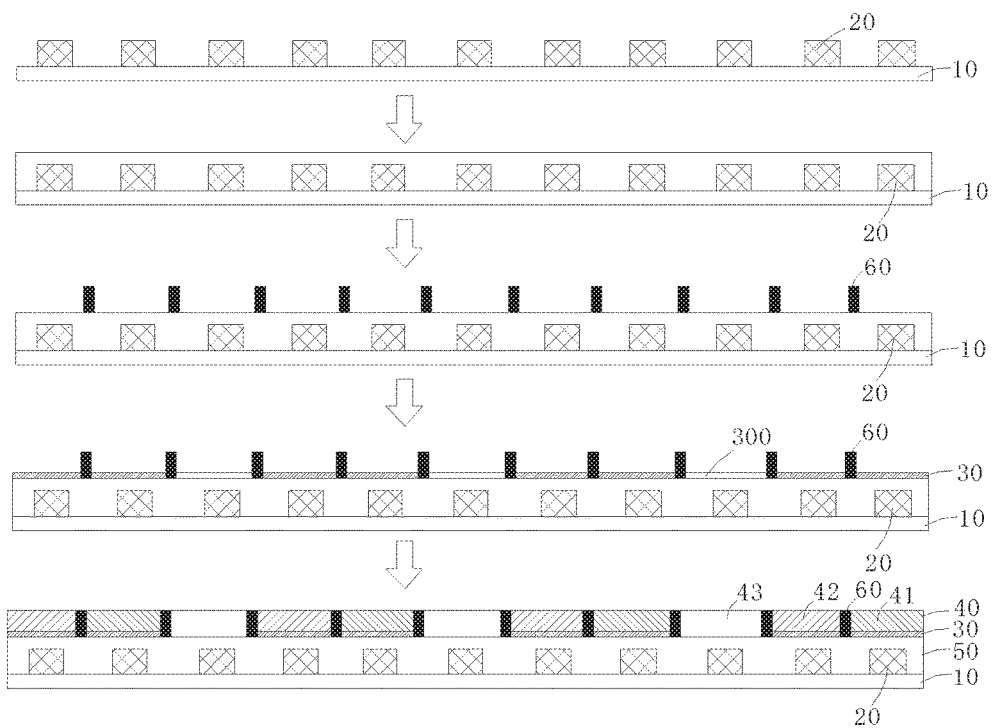
FIG. 2 is a schematic diagram of a manufacturing process of a micro light-emitting diode display device according to an embodiment of the present invention.
Figure 3:
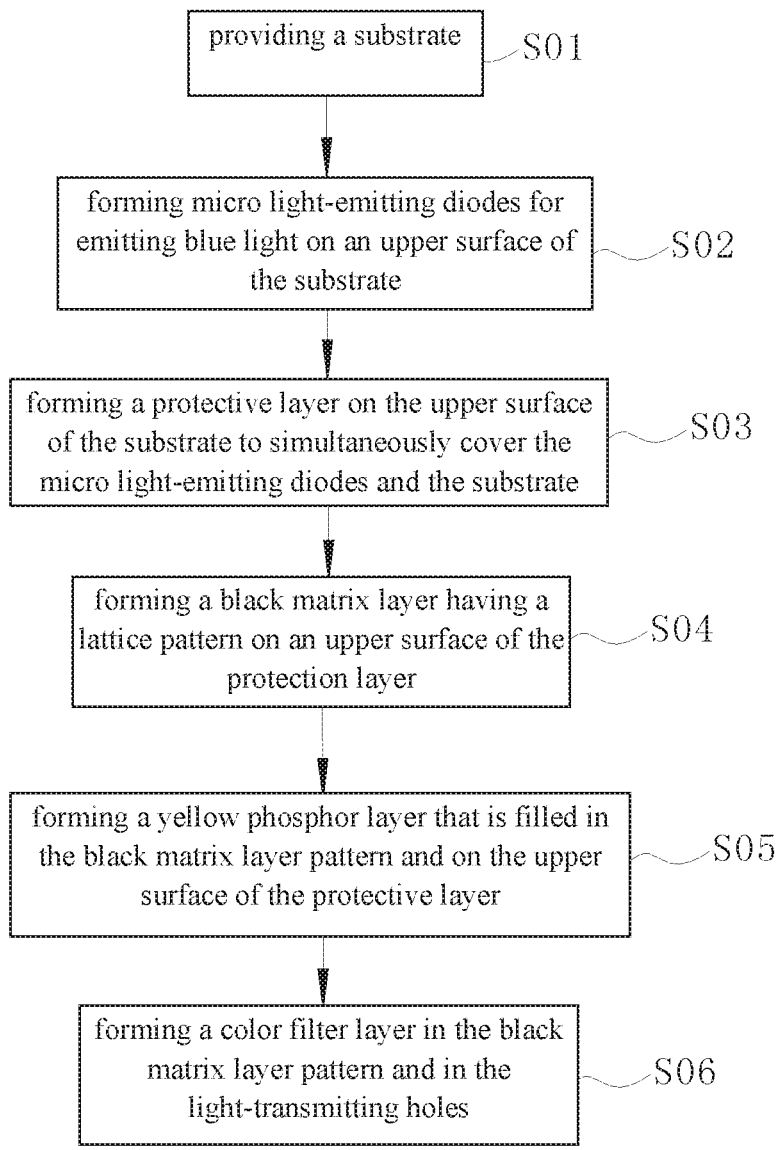
FIG. 3 is a schematic diagram of a method for manufacturing a micro light emitting diode display device according to an embodiment of the present invention.

As shown in FIG. 2 and FIG. 3, the present invention also provides a method for manufacturing a micro light emitting diode display device, which comprises following steps.

In a step of S01, it is to provide a substrate 10, wherein the substrate 10 is a TFT array substrate;

In a step of S02, it is to form micro light-emitting diodes 20 for emitting blue light on an upper surface of the substrate 10. The micro LEDs 20 can be fixed to the substrate 10 by a transfer head and then a transparent conductive film is deposited on the substrate 10. The transparent conductive film is then formed into many electrode lines by etching process to connect respective micro LEDs 20.

In a step of S03, it is to form a protective layer 50 on the upper surface of the substrate 10 to simultaneously cover the micro light-emitting diodes 20 and the substrate 10. The protective layer 50 serves as an encapsulation layer, and has a flat surface, and also serves as a substrate for the subsequent yellow phosphor layer 30 and the black matrix layer 60.

In a step of S04, it is to form a black matrix layer 60 having a lattice pattern on an upper surface of the protection layer 50, so as to prevent mixed colors of light beams of different colors from affecting the display. Each grid corresponds to one micro-light emitting diode 20 and one filter area in the color filter layer 40.

In a step of S05, it is to form a yellow phosphor layer 30 that is filled in the black matrix layer 60 pattern and on the upper surface of the protective layer 50. The yellow phosphor layer 30 is formed with light-transmitting holes 300 at intervals opened to the surface and has a thickness smaller than the thickness of the black matrix layer 60, so as to reserve a space to put the subsequent color filter layer 40 in the black matrix layer 60.

In a step of S06, it is to form a color filter layer 40 in the pattern of the black matrix layer 60 and in the light-transmitting holes 300. The color filter layer 40 comprises a red filter area 41, a green filter area 42 and a light-transmitting area 43. The light-transmitting area 43 of the color filter layer 40 right faces corresponding light transmitting hole 300. The color filter layer 40 is formed by using the protective layer 50 and the yellow phosphor layer 30 as a substrate. That is, portion of the color filter layer 40 that is located in the light-transmitting area 43 is formed on the protection layer 50 and in a space defined by corresponding grid of and the black matrix layer 60 and filled into the light-transmitting holes 300. The portions of the color filter layer 40 that are located in the red filter region 41 and the green filter region 42 are respectively formed in a space surrounded by the yellow phosphor layer 30 and corresponding grid of the black matrix layer 60. The color filter layer 40 is mainly formed by photoresist coating, exposure, developing and baking, and finally a corresponding filter layer is formed. Different filter areas of the color filter layer 40 are made of photoresists of different colors.

The micro light-emitting diodes of the present invention all emit blue light. By means of transferring the micro LEDs to the substrate at one time, and making it to excite the yellow phosphor layer meanwhile cooperate with the color filter layer in a light-emitting direction, a color display purpose could be achieved, which reduces the times of transferring the light-emitting diodes, simplifies the manufacturing process, and reduces technical difficulty for transferring micro LED.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A micro light-emitting diode display device, comprising a substrate, micro light-emitting diodes arrayed on an upper surface of a substrate for emitting blue light, a yellow phosphor layer disposed on a light-emitting side of the micro light-emitting diodes, and a color filter layer disposed on a light-emitting side of the yellow phosphor layer, wherein the color filter layer comprises a red filter area, a green filter area, and a light-transmitting area, the yellow phosphor layer is provided with light-transmitting holes opened to its surface at intervals, and the light-transmitting holes are directly opposite to the light-transmitting area;

wherein the light-transmitting area is a through hole formed in the color filter layer.

2. The micro light-emitting diode display device as claimed in claim 1, wherein each of the micro light-emitting diodes is opposite to one of the red filter area, the green filter area, and the light-transmitting area.

3. The micro light-emitting diode display device as claimed in claim 2, wherein the light-transmitting area is a transparent filter area.

4. The micro light-emitting diode display device as claimed in claim 2, wherein the through hole is filled with a colorless transparent material, and the surface of the colorless transparent material is co-planar with the surface of the color filter layer;

wherein the micro light-emitting diode display device further comprises a protective layer formed on an upper surface of the substrate and covering all the micro-LEDs;

wherein an upper surface of the protective layer is planar, and the yellow phosphor layer is formed on the surface of the protective layer.

5. The micro light-emitting diode display device as claimed in claim 4, wherein the yellow phosphor layer is disposed on the upper surface of the protective layer and bonded to the color filter layer.

6. The micro light-emitting diode display device as claimed in claim 4, wherein the yellow phosphor layer is disposed on a surface of the protective layer that faces the micro-LEDs, and the color filter layer is bonded to the upper surface of the protective layer.

7. The micro light-emitting diode display device as claimed in claim 4, further comprising a black matrix layer for shielding light, wherein each pair of two adjacent areas of the red filter area, the green filter area and the light-transmitting area of the color filter layer is provided with a hollow slit between the two adjacent areas, and the black matrix layer is filled in the slits.

8. The micro light-emitting diode display device as claimed in claim 2, further comprising a protective layer formed on an upper surface of the substrate and covering all the micro-LEDs, wherein an upper surface of the protective layer is planar, and the yellow phosphor layer is formed on the surface of the protective layer.

9. The micro light-emitting diode display device as claimed in claim 8, wherein the yellow phosphor layer is disposed on the upper surface of the protective layer and bonded to the color filter layer.

10. The micro light-emitting diode display device as claimed in claim 8, wherein the yellow phosphor layer is disposed on a surface of the protective layer that faces the micro-LEDs, and the color filter layer is bonded to the upper surface of the protective layer.

11. The micro light-emitting diode display device as claimed in claim 8, further comprising a black matrix layer for shielding light, wherein each pair of two adjacent areas of the red filter area, the green filter area and the light-transmitting area of the color filter layer is provided with a hollow slit between the two adjacent areas, and the black matrix layer is filled in the slits.

12. The micro light-emitting diode display device as claimed in claim 1, further comprising a protective layer formed on an upper surface of the substrate and covering all the micro-LEDs, wherein an upper surface of the protective layer is planar, and the yellow phosphor layer is formed on the surface of the protective layer.

13. The micro light-emitting diode display device as claimed in claim 12, wherein the yellow phosphor layer is disposed on the upper surface of the protective layer and bonded to the color filter layer.

14. The micro light-emitting diode display device as claimed in claim 12, wherein the yellow phosphor layer is disposed on a surface of the protective layer that faces the micro-LEDs, and the color filter layer is bonded to the upper surface of the protective layer.

15. The micro light-emitting diode display device as claimed in claim 12, further comprising a black matrix layer for shielding light, wherein each pair of two adjacent areas of the red filter area, the green filter area and the light-transmitting area of the color filter layer is provided with a hollow slit between the two adjacent areas, and the black matrix layer is filled in the slits.

16. A method of manufacturing a micro light emitting diode display device, comprising steps of:
   providing a substrate;
   forming micro light-emitting diodes for emitting blue light on an upper surface of the substrate;
   forming a protective layer on the upper surface of the substrate to simultaneously cover the micro light-emitting diodes and the substrate;
   forming a black matrix layer having a lattice pattern on an upper surface of the protection layer;
   forming a yellow phosphor layer that is filled in the black matrix layer pattern and on the upper surface of the protective layer, wherein the yellow phosphor layer is formed with light-transmitting holes at intervals opened to the surface and has a thickness smaller than the thickness of the black matrix layer; and
   forming a color filter layer in the black matrix layer pattern and in the light-transmitting holes, wherein the color filter layer comprises a red filter area, a green filter area and a light-transmitting area, and the light-transmitting area is right opposite to the corresponding light transmitting hole.

17. The method of manufacturing a micro light-emitting diode display device as claimed in claim 16, wherein in the step of forming micro light-emitting diodes for emitting blue light on an upper surface of the substrate, the micro LEDs are fixed to the substrate and then a transparent conductive film is deposited on the substrate, and then formed into many electrode lines by etching process to connect respective micro LEDs.

18. The method of manufacturing a micro light-emitting diode display device as claimed in claim 17, wherein an upper surface of the protective layer is planar, and the yellow phosphor layer is formed on the surface of the protective layer by coating.

\* \* \* \* \*